(12) United States Patent
Huang et al.

(10) Patent No.: US 11,336,215 B2
(45) Date of Patent: May 17, 2022

(54) DISPLAY AND ROTATING METHOD THEREOF

(71) Applicant: PEGATRON CORPORATION, Taipei (TW)

(72) Inventors: Tai-Jung Huang, Taipei (TW); Pei-Chin Wang, Taipei (TW); Chien-Sheng Lo, Taipei (TW); Yu-Lin Fang, Taipei (TW); Yu-Ting Tsai, Taipei (TW)

(73) Assignee: PEGATRON CORPORATION, Taipei (TW)

( * ) Notice: Subject to any disclaimer, the term of this patent is extended or adjusted under 35 U.S.C. 154(b) by 0 days.

(21) Appl. No.: 17/080,255

(22) Filed: Oct. 26, 2020

(65) Prior Publication Data

US 2021/0152114 A1    May 20, 2021

(30) Foreign Application Priority Data

Nov. 19, 2019   (TW) ................... 108141914

(51) Int. Cl.
*H02P 23/18* (2016.01)
*H05K 5/02* (2006.01)
*H04N 5/655* (2006.01)

(52) U.S. Cl.
CPC ......... *H02P 23/186* (2016.02); *H05K 5/0234* (2013.01); *H04N 5/655* (2013.01)

(58) Field of Classification Search
CPC .... H02P 5/46; H02P 5/69; H02P 5/695; H02P 6/00; H02P 6/005; H02P 6/04; H02P 6/22; H02P 6/26; H02P 6/03; H02P 7/00; H02P 7/03; H02P 7/05; H02P 8/06; H02P 25/00; H02P 25/04; H02P 27/00; H02P 23/186; H02P 1/00; H02P 1/04; H02P 1/163; H02P 1/18; H02P 1/24; H02P 1/26; H02P 1/265; H02P 1/28; H02P 1/42; H02P 1/46; H02P 1/465; H02P 1/54; H02P 3/00; H02P 3/24;
(Continued)

(56) References Cited

U.S. PATENT DOCUMENTS

| | | | |
|---|---|---|---|
| 11,054,916 B2 * | 7/2021 | Lee | ............................ G06T 3/60 |
| 2020/0301518 A1 * | 9/2020 | Lee | ......................... G09G 5/005 |

FOREIGN PATENT DOCUMENTS

| | | | | |
|---|---|---|---|---|
| EP | 3444798 | | 2/2019 | |
| EP | 3444798 A1 * | | 2/2019 | ........... F16M 11/105 |

* cited by examiner

*Primary Examiner* — Antony M Paul
(74) *Attorney, Agent, or Firm* — J.C. Patents

(57) ABSTRACT

A display including a supporting stand and a display panel is provided. The supporting stand has a rotating assembly, a drive motor, and a microcontroller. The display panel has a computing device. The drive motor is connected to the rotating assembly for driving the rotating assembly to rotate. The microcontroller is coupled to the drive motor for controlling the drive motor. The display panel is disposed on the rotating assembly. The computing device is coupled to the microcontroller. The computing device is configured to read an image. The computing device transmits a signal to the microcontroller based on an orientation of the image being portrait or landscape so that the microcontroller switches on the drive motor and the rotating assembly drives the display panel to rotate relative to the supporting stand for switching a rotating position of the display panel to a portrait mode or a landscape mode.

12 Claims, 7 Drawing Sheets

(58) Field of Classification Search
CPC .. H02P 4/00; H02P 5/00; H04N 5/655; H05K 5/0234; F16M 11/10; G09G 3/20
See application file for complete search history.

|  |  | Orientation | | | | | | | |
|---|---|---|---|---|---|---|---|---|---|
|  |  | 1 | 2 | 3 | 4 | 5 | 6 | 7 | 8 |
| $0^{th}$ row |  | top | top | bottom | bottom | left-hand | right-hand | right-hand | left-hand |
| $0^{th}$ column |  | left-hand | right-hand | right-hand | left-hand | top | top | bottom | bottom |

FIG. 3

DISPLAY AND ROTATING METHOD THEREOF

CROSS-REFERENCE TO RELATED APPLICATION

This application claims the priority benefit of Taiwan application no. 108141914, filed on Nov. 19, 2019. The entirety of the above-mentioned patent application is hereby incorporated by reference herein and made a part of this specification.

TECHNICAL FIELD

The disclosure relates to a display, and more particularly, to a display that automatically rotates based on an image orientation.

BACKGROUND

Existing display products, such as digital photo frames, digital TVs, etc., are mostly unable to turn a screen to a portrait mode, and can only maintain a traditional landscape mode, so an image can only be displayed in the landscape mode on the screen. If the image is in a portrait format, the portrait image cannot be displayed in a state of close to full screen on a landscape screen in the landscape mode, and a large area of black blocks will be generated on both sides of the screen. This indicates that an effective display area of the screen is insufficient, and the image is limited to a limited area of the screen. Consequently, a display size of the image is reduced on the screen, thereby affecting the user's viewing experience.

Nowadays, display products that can manually rotate the screen have been developed, and the screen can be manually rotated and adjusted to the portrait mode or the horizontal mode, so that the portrait image or the landscape image can obtain the largest display area on the screen. However, when multiple images in either portrait or landscape modes are continuously displayed, the user has to keep on manually rotating the screen in order to view the images in the best display state, which causes the inconvenience and laborious shortcomings of switching the screen mode.

SUMMARY

The disclosure provides a display capable of automatically switching a viewing mode to match orientations of images so that the images can be output on the display panel in a state close to full screen, thereby enhancing the user's viewing experience.

A display of the disclosure includes a supporting stand and a display panel. The supporting stand has a rotating assembly, a drive motor, and a microcontroller. The display panel has a computing device. The drive motor is connected to the rotating assembly for driving the rotating assembly to rotate. The microcontroller is coupled to the drive motor for controlling the drive motor. The display panel is disposed on the rotating assembly. The computing device is coupled to the microcontroller. The computing device is configured to read an image. The computing device transmits a signal to the microcontroller based on an orientation of the image being portrait or landscape so that the microcontroller switches on the drive motor and the rotating assembly drives the display panel to rotate relative to the supporting stand for switching a rotating position of the display panel to a portrait mode or a landscape mode.

The disclosure provides a rotating method for a display to determine an image orientation according to information of image like size and orientation so that the display can be automatically switched to a proper display mode according to the image orientation.

In the rotating method for the display, the display includes a supporting stand and a display panel. The supporting stand includes a rotating assembly. The display panel is disposed on the rotating assembly. The rotating method of the display includes: reading an exchangeable image file format of an image to obtain a horizontal size value, a vertical size value and an orientation field value of the image, and determining whether an orientation of the image is portrait or landscape by the computing device. The computing device is used to determine whether a rotating position of the display panel is in a portrait mode or a landscape mode and compare whether the rotating position of the display panel matches the orientation of the image. Here, the rotating position of the display panel being the portrait mode matches the orientation of the image being portrait, and the rotating position of the display panel being the landscape mode matches the orientation of the image being landscape. When the rotating position of the display panel does not match the orientation of the image, the computing device drives the rotating assembly so that the rotating position of the display panel is in the portrait mode or the landscape mode that matches the orientation of the image.

Based on the above, the display of the disclosure has the computing device and the corresponding software, which can determine whether the image is portrait or landscape based on the information of the image such as the size and the orientation. After the image orientation is determined, the computing device transmits the corresponding digital signal to the microcontroller so the drive motor drives the rotating assembly to rotate and switch the display panel to the portrait mode or the landscape mode. In this way, both portrait and landscape images can be output on the display panel in full screen, thereby enhancing the user's viewing experience.

Furthermore, when multiple images are continuously output, the computing device sequentially compares whether the display panel matches the image, and automatically switch the display panel to the portrait mode or the landscape mode. Compared with the manual adjustment of the display in the prior art, the inconvenience and laborious shortcomings can be solved.

To make the aforementioned more comprehensible, several embodiments accompanied with drawings are described in detail as follows.

BRIEF DESCRIPTION OF THE DRAWINGS

FIG. 3 is a table diagram showing orientation field values.

DETAILED DESCRIPTION

Figure 1A:
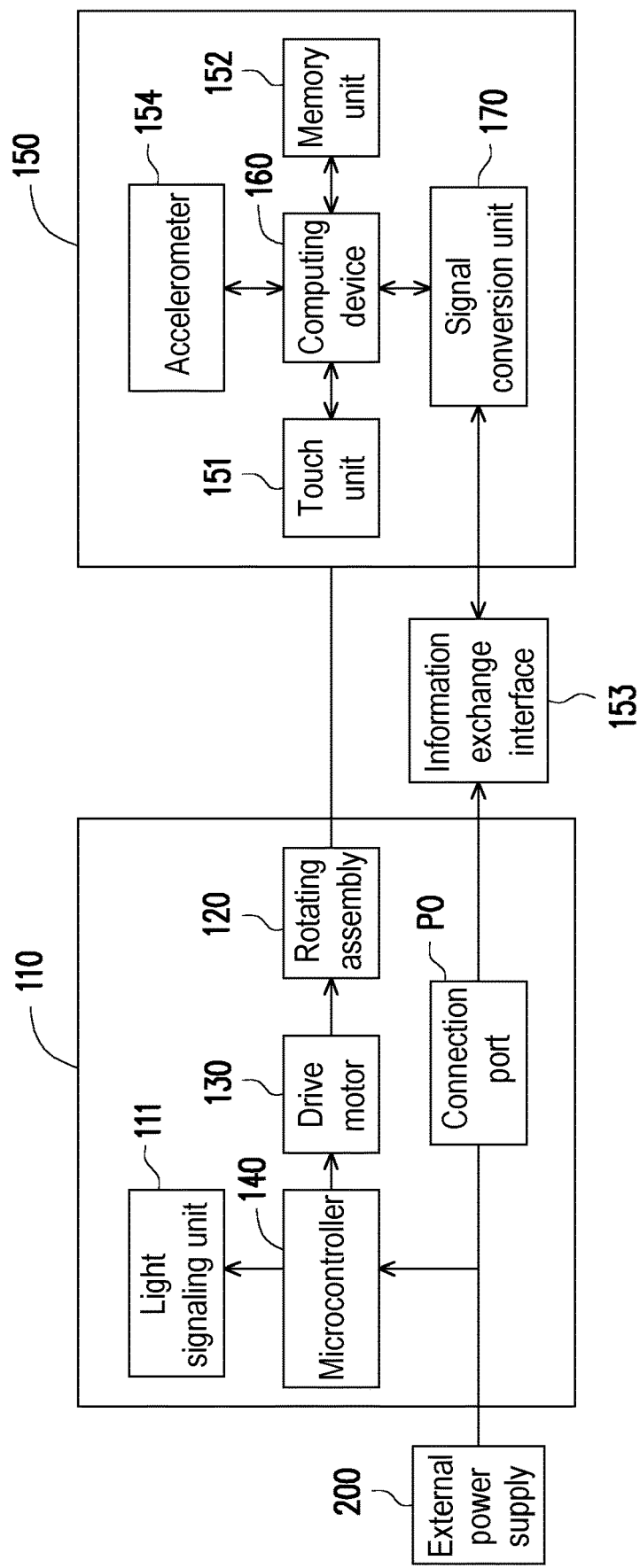
FIG. 1A is a block diagram of a structure of a display according to an embodiment of the invention.
Figure 1B:
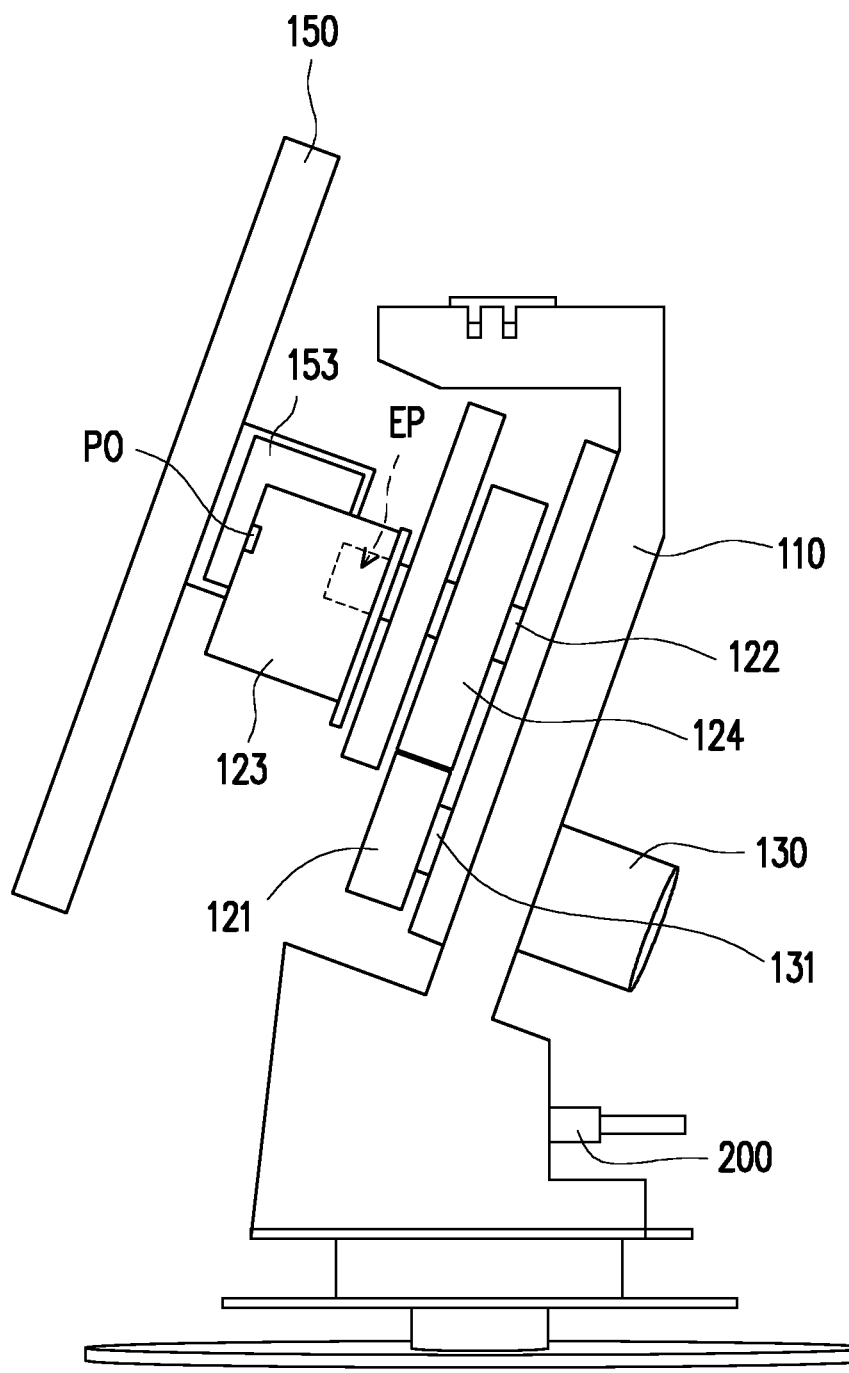
FIG. 1B is a schematic side view of a display according to an embodiment of the invention.
Figure 1C:
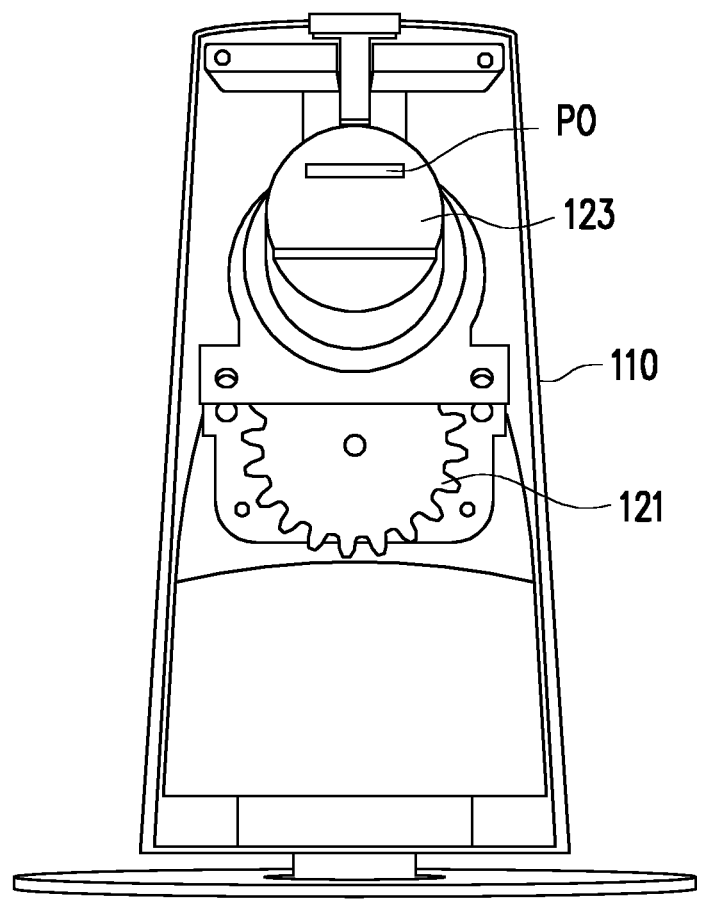
FIG. 1C is a schematic front view of some elements of a display according to an embodiment of the invention.

FIG. 1A is a block diagram of a structure of a display according to an embodiment of the invention. FIG. 1B is a schematic side view of a display according to an embodiment of the invention. FIG. 1C is a schematic front view of some elements of a display according to an embodiment of the invention.

Referring to FIG. 1A to FIG. 1C, a display 100 of the invention is, for example, a digital photo frame, a digital TV, a desktop computer, or other electronic devices with image display functions. Users are able to transfer multiple image files to a built-in storage device of the display 100 through various interfaces such as Wifi, Bluetooth, Universal Serial BUS (USB) and other wireless or wired interfaces so that the images can be continuously displayed through the display 100.

A display 100 of the present embodiment includes a supporting stand 110 and a display panel 150. The supporting stand 110 has a rotating assembly 120, a drive motor 130, and a microcontroller 140. The display panel 150 has a computing device 160. The drive motor 130 is connected to the rotating assembly 120 and configured to drive the rotating assembly 120 to rotate clockwise or counterclockwise. The drive motor 130 is, for example, a DC motor, an AC motor, or a pulse motor, and the invention does not limit the type of the motor.

The microcontroller 140 is coupled to the drive motor 130 and configured to control the drive motor 130 to be switched on or off. In detail, the microcontroller 140 is, for example, a microcomputer having a central processing unit, a memory, a timer/counter, and an input/output interface. The required software functions can be written into the microcontroller 140 through a specific software assembler to achieve effect of an automatic control.

The display panel 510 is disposed on the rotating assembly 120. The display panel 150 and the rotating assembly 120 are connected as a whole, and it means that the rotating assembly 120 can drive the display panel 150 to rotate synchronously. The computing device 160 is disposed in the display panel 150 and coupled to the microcontroller 140. The computing device 160 serves as an operation processing core of the display 100.

Furthermore, the display panel 150 includes a touch unit 151 coupled to the computing device 160 and adapted to sense an external force acted on the display panel 150. For example, when the external force is present (e.g., press with finger or pen), the touch unit 151 uses sensing methods such as sound waves, capacitance, resistance, or infrared to determine the external force acted on a specific position or a specific graphic button of the display panel 150. Moreover, the display panel 150 can generate corresponding commands or actions according to pre-built programs instead of the existing mechanical input devices.

In short, the display 100 of the invention is configured to continuously display multiple images, and can automatically rotate itself. For example, when an image IM is transmitted to a memory unit 152 of the display panel 150, the computing device 160 can read an exchangeable image file (Exif) format of the image IM from the memory unit 152 to determine whether the image IM is portrait or landscape. In addition, the exchangeable image file (Exif) format is a standard file format which includes, other than information of the image, additional information such as time, resolution, camera model, aperture value, ISO value, file Information about size, horizontal size value X, vertical size value Y, orientation field value (Orientation) value, etc.

Figure 1D:
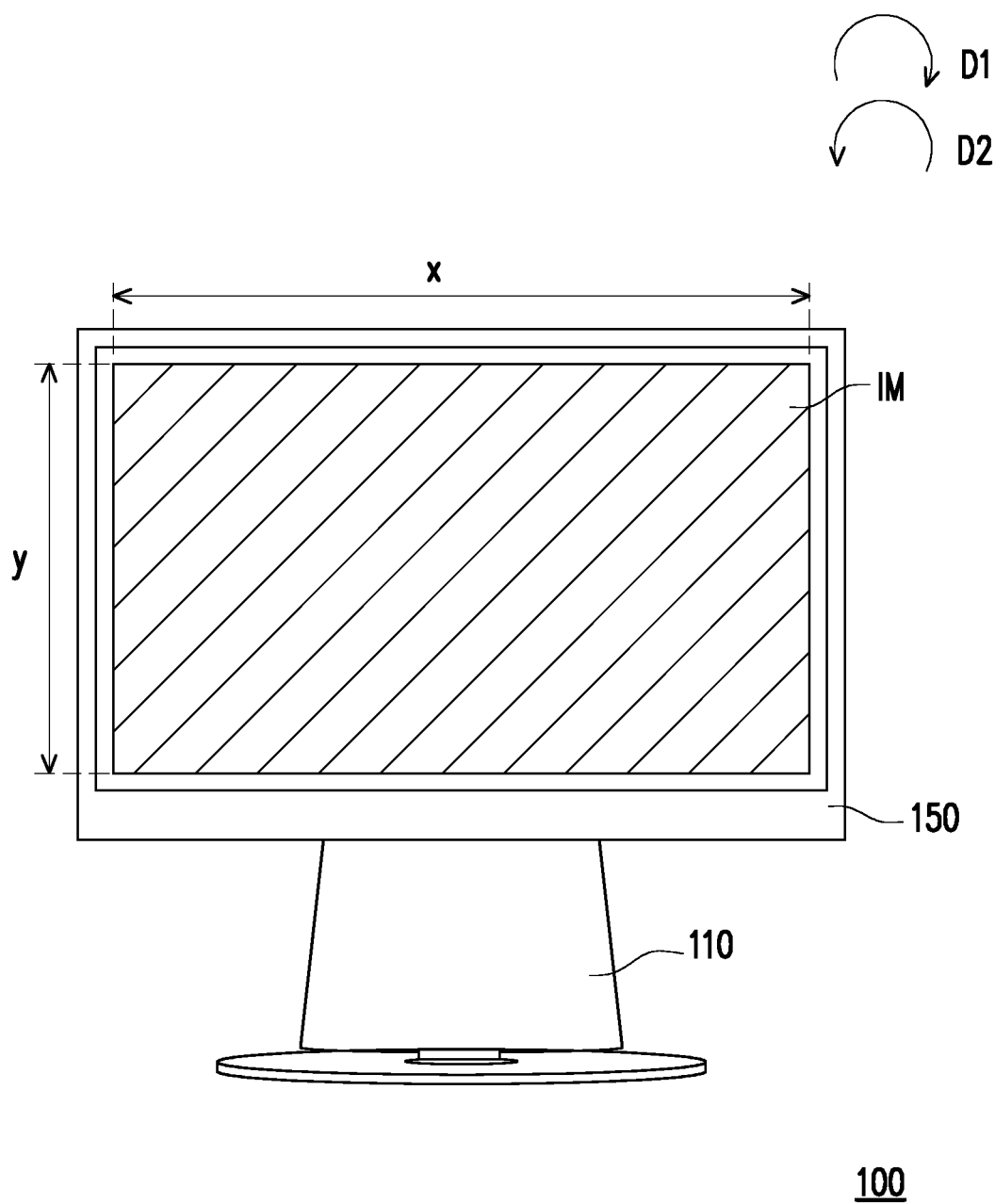
FIG. 1D is a schematic diagram of a landscape mode of a display according to an embodiment of the invention.
Figure 1E:
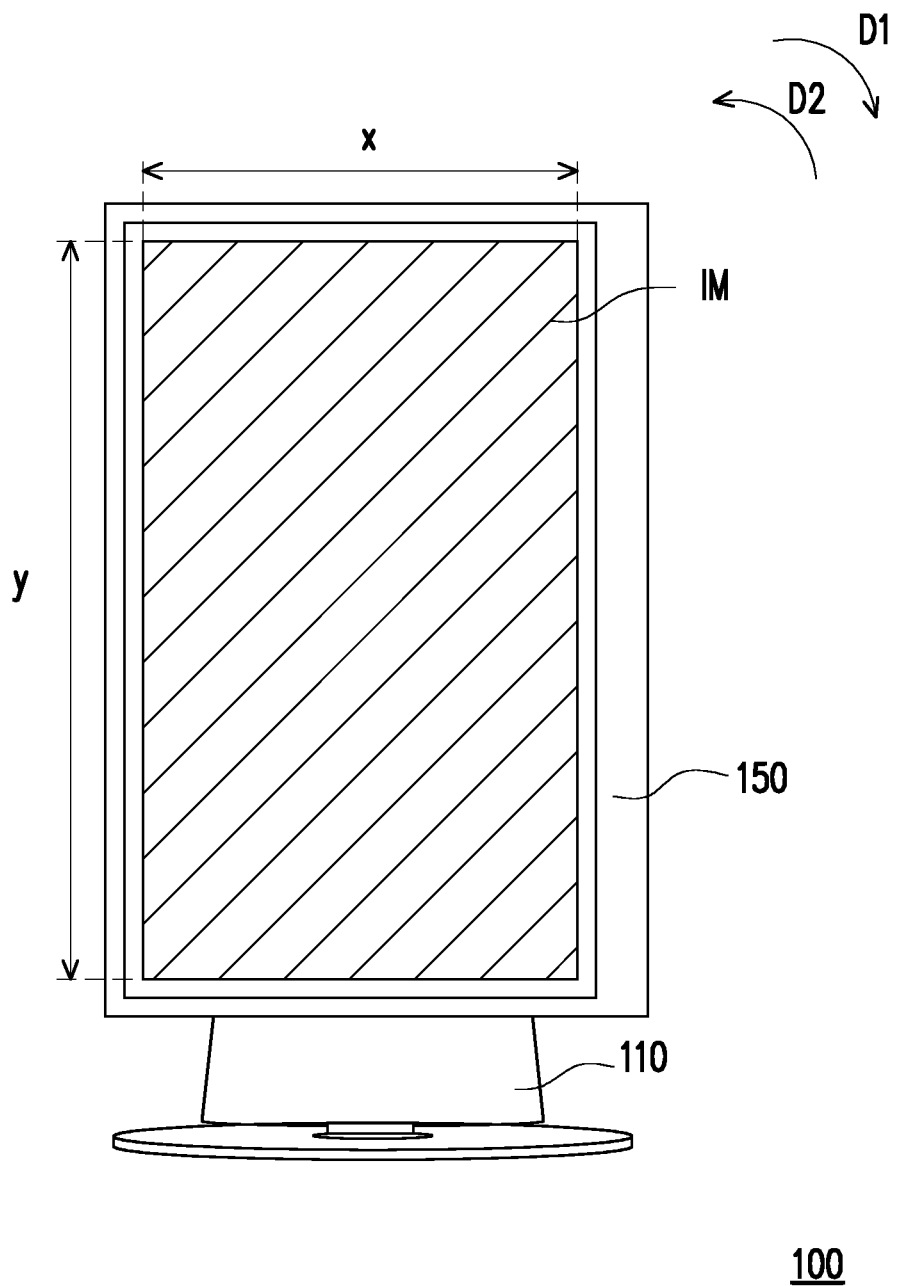
FIG. 1E is a schematic diagram of a portrait mode of a display according to an embodiment of the invention.

Then, the computing device 160 reads the image, determines whether an orientation of the image is portrait or landscape, and transmits a corresponding digital signal to the microcontroller 140 based on the orientation of the image IM being portrait or landscape. After receiving the digital signal, the microcontroller 140 turns on an automatic mode to switch on the drive motor 130. Then, the drive motor 130 drives the rotating assembly 120 to pivot, so that the rotating assembly 120 drives the display panel 150 to rotate relative to the supporting stand 110 for switching a rotating position of the display panel 150 to a portrait mode or a landscape mode that matches the orientation of the image IM. FIG. 1D is a schematic diagram of a landscape mode of a display according to an embodiment of the invention. FIG. 1E is a schematic diagram of a portrait mode of a display according to an embodiment of the invention.

Referring to FIG. 1B and FIG. 1C, the rotating assembly 120 includes a driving gear 121, a pivot 122, a rotating block 123 and a driven gear 124.

The driving gear 121 is fixed on a shaft 131 of the drive motor 130. The pivot 122 is pivoted on the supporting stand 110 and located above the driving gear 121. The rotating block 123 is fixed on an end portion EP of the pivot 122 away from the supporting stand 110. The driven gear 124 is fixed on the pivot 122 and relatively far from the end portion EP, and the driven gear 124 meshes with the driving gear 121.

For instance, the shaft 131 of the drive motor 130 is adapted to drive the driving gear 121 to rotate in a first direction D1, and the driving gear 121 drives the driven gear 124 to rotate in a second direction D2 opposite to the first direction D1, so that the pivot 122 and the rotating block 123 simultaneously rotate in the second direction D2. In this embodiment, the first direction D1 (or the second direction D2) can be clockwise or counterclockwise. When the first direction D1 is clockwise, the second direction D2 is counterclockwise, and vice versa.

Referring to FIG. 1A to FIG. 1C, the rotating block 123 has a connection port PO (including serial port, PS/2 port, or USB port) coupled to an information exchange interface 153 (including PS/2 interface or USB interface) of the display panel 150. The digital signal of the computing device 160 is adapted to be transmitted to the microcontroller 140 through the information exchange interface 153 and the connection port PO. An external power supply 200 is adapted to charge the display panel 150 through the connection port PO and the connection port 153.

Referring to FIG. 1A, the display 100 further includes a signal conversion unit 170 coupled to the computing device 160 and configured to convert the digital signal of the computing device 160 into a control signal. The control signal matches a format of the microcontroller 140. The information exchange interface 153 is coupled to the microcontroller 140, and the information exchange interface 153 is configured to transmit the control signal to the microcontroller 140 to achieve the automatic control.

The display panel 150 further includes an accelerometer 154 coupled to the computing device 160. The accelerometer 154 is configured to measure two gravity acceleration components (Ax, Ay) in a horizontal direction and a vertical direction of the display panel 150 and convert the two gravity acceleration components (Ax, Ay) into a digital signal to be transmitted to the computing device 160, which then compares the two gravity acceleration components (Ax, Ay) with preset gravity acceleration components (A0, A0) for determining the exact rotating position of the display panel 150.

When the display panel 150 is switched to the portrait mode or the landscape mode, the microcontroller 140 controls the rotating assembly 120 to stop rotating. When the display panel 150 is not the portrait mode or the landscape mode, the microcontroller 140 controls the rotating assembly 120 to keep on rotating.

Referring to FIG. 1A, the supporting stand 110 further includes a light signaling unit 11 coupled to the microcontroller 140. When the microcontroller 140 is operating, the light signaling unit 111 is switched on to emit light to remind the user. When the microcontroller 140 stops operating, the light signaling unit 111 is switched off.

Figure 2:
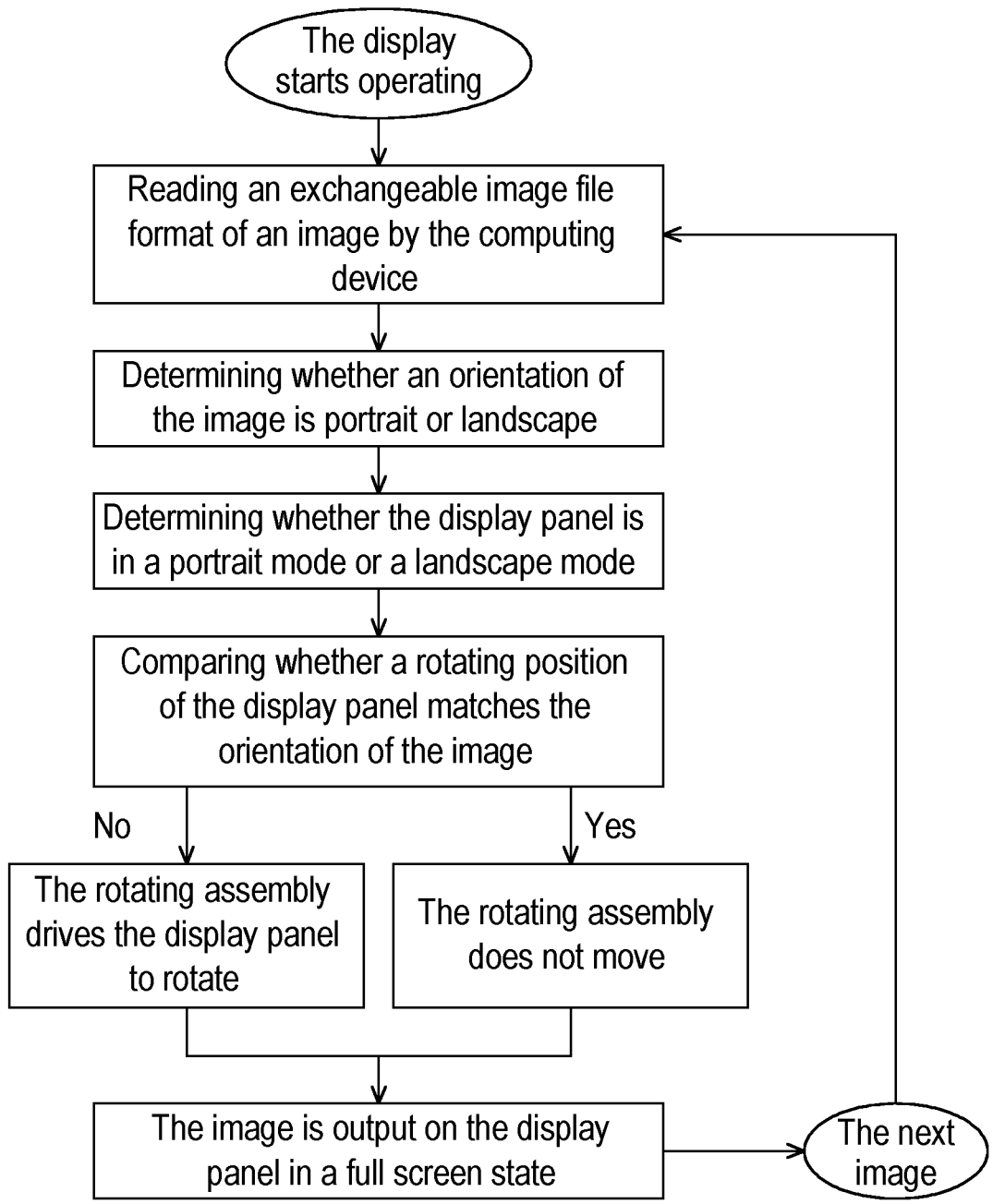
FIG. 2 is a flowchart of operations of a display according to an embodiment of the invention.

FIG. 2 is a flowchart of operations of a display according to an embodiment of the invention. FIG. 3 is a table diagram showing orientation field values (Orientation).

Referring to FIG. 2, FIG. 1A, FIG. 1D and FIG. 1E together, the operation process of the display 100 of this embodiment is as follows.

The display 100 is activated to start operating so that a plurality of images IM are stored in the memory unit 152 of the display panel 150 and output on the display panel 150 in sequence.

While displaying, the computing device 160 reads the exchangeable image file format of an image IM to obtain a horizontal size value X, a vertical size value Y and an orientation field value (Orientation) of the image, and determines whether the orientation of the image IM is portrait or landscape.

Referring to FIG. 3, FIG. 1D and FIG. 1E together, there are eight categories of the orientation field value. In short, the orientation field value (Orientation) is rotating orientation information when a camera captures the image. Here, "$0^{th}$ row" is a horizontal starting point of the camera, and "$0^{th}$ column" is a vertical starting point of the camera. Then, according to combinations of up, down, left and right, the orientation field value (Orientation) from 1 to 8 can be summarized.

For example, when the orientation field value (Orientation) of the image IM is 1, it means that when the camera captures the image IM, the horizontal starting point ($0^{th}$ row) is at the top, and vertical starting point ($0^{th}$ column) on the left-hand. When the orientation field value (Orientation) of the image IM is 3, it means that when the camera captures the image IM, the horizontal starting point ($0^{th}$ row) is at the bottom, and vertical starting point ($0^{th}$ column) on the right-hand. This means that when switching from the direction field value of 1 to the direction field value of 3, the camera needs to rotate 180 degrees clockwise or counterclockwise. In addition, the orientation field values 2, 4, 5, and 7 are mirrored flips of the orientation field values 1, 3, 6, and 8, respectively.

In detail, the image IM is portrait when the horizontal size value X/the vertical size value Y of the image IM is greater than or equal to 1 and the orientation field value (Orientation) is one of 5, 6, 7 and 8; the image IM is portrait when the horizontal size value X/the vertical size value Y of the image IM is less than 1 and the orientation field value (Orientation) is one of 1, 2, 3 and 4. The image IM under the above categories is determined as portrait and suitable for the display panel 150 in the portrait mode (see FIG. 1E) by the computing device 160 and the recognition software.

The image IM is landscape when the horizontal size value X/the vertical size value Y of the image IM is greater than or equal to 1 and the orientation field value (Orientation) is one of 1, 2, 3 and 4; the image IM is landscape when the horizontal size value X/the vertical size value Y of the image IM is less than 1 and the orientation field value (Orientation) of the image IM is one of 5, 6, 7 and 8. The image IM under the above categories is determined as landscape and suitable for the display panel 150 in the landscape mode (see FIG. 1D) by the computing device 160 and the recognition software.

The computing device 160 uses the accelerometer 154 to determine the rotation position of the display panel 150 so as to determine whether the display panel 150 is in the portrait mode or the landscape mode, or located at other rotating angle.

Next, the computing device 160 compares whether the rotating position of the display panel 150 matches the orientation of the image IM. Here, the rotating position of the display panel 150 being the portrait mode matches the orientation of the image IM being portrait, and the rotating position of the display panel 150 being the landscape mode matches the orientation of the image IM being landscape.

When the rotating position of the display panel 150 does not match the orientation of the image IM, the computing device 160 and the microcontroller 140 drive the rotating assembly 120 to rotate in the first direction D1 or the second direction D2 so that the rotating position of the display panel 150 is in the portrait mode or the landscape mode that matches the orientation of the image IM.

When the rotating position of the display panel 150 matches the orientation of the image IM, the rotating assembly 120 is stationary.

Once the rotating position of the display panel 150 matches the orientation of the image IM, the image IM may be output on the display panel 150 in full screen. Then, the computing device 160 reads another one of the images IM of the memory unit 152 and repeats the above determination steps to continuously display multiple images IM. The display panel 150 can be switched to the portrait mode or the landscape mode through this automatic control technology to correspondingly display each of the (portrait or landscape) images IM of different orientations in full screen.

Referring to FIG. 1D and FIG. 1E together, the following describes a comparison scenario of the image IM and the display panel 150 in detail.

The display panel is in the landscape mode when one of the images IM (a currently displayed image) is landscape; the display panel 150 is in the portrait mode when another one of the images IM (a to be displayed image) is landscape or when one of the images IM (the currently displayed image) is portrait; the computing device 160 does not drive the rotating assembly 120 so that the display panel 150 does not rotate when another one of the images IM (the to be displayed image) is portrait.

The display panel is in the landscape mode when one of the images IM (the currently displayed image) is landscape; the computing device rotates the display panel 150 by 90 degrees in the first direction D1 through the rotating assembly when another one of the images IM (the to be displayed image) is portrait.

The display panel 150 is in the portrait mode when one of the images IM (the currently displayed image) is portrait; the computing device rotates the display panel 150 by 90 degrees in the second direction D2 opposite to the first direction D1 through the rotating assembly to be switched to the landscape mode when another one of the images IM (the to be displayed image) is landscape.

In other embodiments, the rotating angle of the display panel 150 includes 0 to 360 degrees (not limited to the portrait mode or the landscape mode). The display panel 150 can also be continuously rotated in the first direction D1 or the second direction D2 and switched to the portrait mode or the landscape mode (not limited to the alternate switching mode of forward and reverse).

In summary, the display of the invention has the computing device and the corresponding software, which can determine whether the image is portrait or landscape based on the information of the image such as the size and the orientation. After the image format is determined, the computing device transmits the corresponding digital signal to the microcontroller so the drive motor drives the rotating assembly to rotate and switch the display panel to the portrait mode or the landscape mode. In this way, both portrait and landscape images can be output on the display panel in a state close to full screen, thereby enhancing the user's viewing experience.

Furthermore, when multiple images are continuously output, the computing device sequentially compares whether the display panel matches the image, and automatically switch the display panel to the portrait mode or the landscape mode. Compared with the manual adjustment of the display in the prior art, the inconvenience and laborious shortcomings can be solved.

Although the present disclosure has been described with reference to the above embodiments, it will be apparent to one of ordinary skill in the art that modifications to the described embodiments may be made without departing from the spirit of the disclosure. Accordingly, the scope of the disclosure will be defined by the attached claims and not by the above detailed descriptions.

The invention claimed is:

1. A display, comprising:
   a supporting stand, comprising:
      a rotating assembly;
      a drive motor, connected to the rotating assembly, and configured to drive the rotating assembly to rotate;
      a microcontroller, coupled to the drive motor, and configured to control the drive motor; and
   a display panel, disposed on the rotating assembly, and comprising:
      a computing device, coupled to the microcontroller, the computing device being configured to read an image, the computing device transmitting a signal to the microcontroller based on an orientation of the image being portrait or landscape so that the microcontroller switches on the drive motor and the rotating assembly drives the display panel to rotate relative to the supporting stand for switching a position of the display panel to a portrait mode or a landscape mode,
   wherein the computing device is adapted to read an exchangeable image file format of the image, and obtain a horizontal size value, a vertical size value and an orientation field value of the image for determining whether the orientation of the image is portrait or landscape.

2. The display of claim 1, wherein the rotating assembly comprises:
   a driving gear, fixed on a shaft of the drive motor;
   a pivot, pivoted on the supporting stand and located above the driving gear;
   a rotating block, fixed on an end portion of the pivot away from the supporting stand; and
   a driven gear, fixed on the pivot and relatively far from the end portion, the driven gear meshing with the driving gear, wherein the drive motor is adapted to drive the driving gear to rotate in a first direction, and the driving gear drives the driven gear to rotate in a second direction opposite to the first direction, so that the pivot and the rotating block simultaneously rotate in the second direction.

3. The display of claim 2, wherein the rotating block has a connection portion coupled to the display panel, and a digital signal of the computing device is adapted to be transmitted to the microcontroller through the connection port.

4. The display of claim 3, further comprising: an information exchange interface, coupled to the microcontroller and configured to transmit a control signal to the microcontroller.

5. The display of claim 3, wherein an external power supply is adapted to charge the display panel through the connection port.

6. The display of claim 1, wherein the display panel further comprises an accelerometer coupled to the computing device, the accelerometer is configured to measure two gravity acceleration components in a horizontal direction and a vertical direction of the display panel and convert the two gravity acceleration components into a digital signal to be transmitted to the computing device for determining the position of the display panel, and the microcontroller controls the rotating assembly to stop rotating when the position of the display panel is switched to the portrait mode or the landscape mode.

7. The display according to claim 1, further comprising: a light signaling unit, coupled to the microcontroller, the light signaling unit being switched on when the microcontroller is operating, the light signaling unit being switched off when the microcontroller stops operating.

8. The display of claim 1, wherein the orientation of the image is portrait when the horizontal size value/the vertical size value of the image is greater than or equal to 1 and the orientation field value is one of 5, 6, 7 and 8; the orientation of the image is portrait when the horizontal size value/the vertical size value of the image is less than 1 and the orientation field value is one of 1, 2, 3 and 4.

9. The display of claim 1, wherein the orientation of the image is landscape when the horizontal size value/the vertical size value of the image is greater than or equal to 1 and the orientation field value is one of 1, 2, 3 and 4; the orientation of the image is landscape when the horizontal size value/the vertical size value of the image is less than 1 and the orientation field value is one of 5, 6, 7 and 8.

10. A rotating method for a display, the display comprising a supporting stand and a display panel, the supporting stand comprising a rotating assembly, the display panel being disposed on the rotating assembly, the display panel comprising a computing device, the rotating method of the display comprising:
   reading an exchangeable image file format of an image to obtain a horizontal size value, a vertical size value and an orientation field value of the image, and determining whether an orientation of the image is portrait or landscape by the computing device;
   comparing a position of the display panel matches the orientation of the image by the computing device, wherein the position of the display panel being the portrait mode matches the orientation of the image being portrait, and the position of the display panel being the landscape mode matches the orientation of the image being landscape; and driving the rotating assembly by the computing device, so that the position of the display panel is in the portrait mode or the landscape mode that matches the orientation of the image based on the position of the display panel does not match the orientation of the image.

11. The rotating method of claim 10, wherein the orientation of the image is portrait when the horizontal size value/the vertical size value of the image is greater than or equal to 1 and the orientation field value is one of 5, 6, 7 and 8; the orientation of the image is portrait when the horizontal size value/the vertical size value of the image is less than 1 and the orientation field value is one of 1, 2, 3 and 4.

12. The rotating method of claim 10, wherein the orientation of the image is landscape when the horizontal size value/the vertical size value of the image is greater than or equal to 1 and the orientation field value is one of 1, 2, 3 and 4; the orientation of the image is landscape when the horizontal size value/the vertical size value of the image is less than 1 and the orientation field value is one of 5, 6, 7 and 8.

\* \* \* \* \*